(12) United States Patent
Suzuki

(10) Patent No.: US 6,762,490 B2
(45) Date of Patent: Jul. 13, 2004

(54) SEMICONDUCTOR DEVICE AND METHOD FOR PRODUCING THE SAME

(75) Inventor: Shinsuke Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/246,740

(22) Filed: Sep. 19, 2002

(65) Prior Publication Data

US 2003/0080405 A1 May 1, 2003

(30) Foreign Application Priority Data

Oct. 29, 2001 (JP) ........................................ 2001-330928

(51) Int. Cl.[7] ............................................. H01L 23/48
(52) U.S. Cl. ........................ 257/692; 257/676; 257/686; 257/712
(58) Field of Search ................................ 257/676, 686, 257/692, 712, 690; 357/70, 72

(56) References Cited

U.S. PATENT DOCUMENTS

| 4,975,761 A | * | 12/1990 | Chu | ............................. 257/686 |
| 5,138,430 A | * | 8/1992 | Gow et al. | ................... 257/712 |
| 5,904,506 A | * | 5/1999 | Yoneda et al. | ............... 438/124 |
| 2001/0011768 A1 | * | 8/2001 | Kohara et al. | ............... 257/692 |

FOREIGN PATENT DOCUMENTS

| JP | 06-045387 | | 2/1994 | |
| JP | 07-142523 | * | 6/1995 | ........... H01L/21/60 |
| JP | 08-130226 | | 5/1996 | |

* cited by examiner

Primary Examiner—David Nelms
Assistant Examiner—Dao H. Nguyen
(74) Attorney, Agent, or Firm—Volentine Francos, PLLC

(57) ABSTRACT

A semiconductor device, wherein contact between bonding wires is prevented, and a method for producing the same are disclosed. A contact prevention member is placed on outer bonding wires so as to be interposed between the outer bonding wires and inner bonding wires, thereby preventing the inner wires and the outer wires from coming into contact with each other.

20 Claims, 12 Drawing Sheets

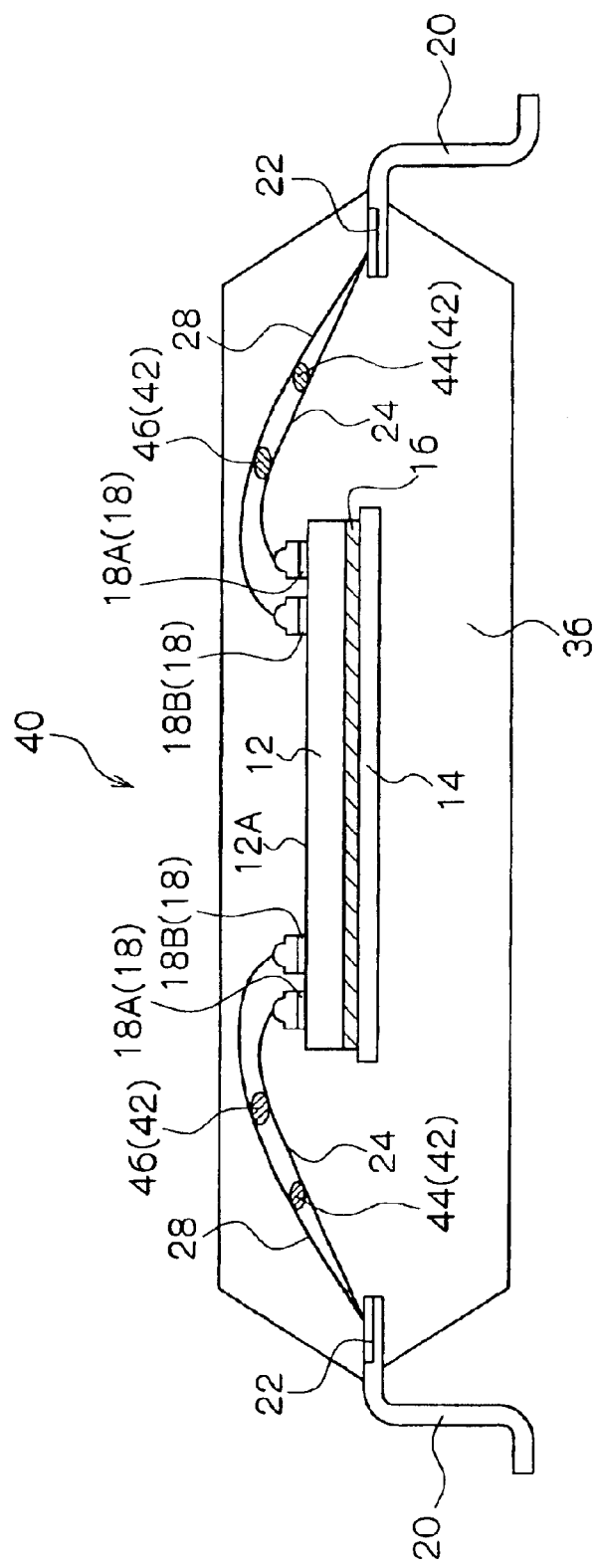

SEMICONDUCTOR DEVICE AND METHOD FOR PRODUCING THE SAME

BACKGROUND OF THE INVENTION

1. Field of the Invention

The present invention relates to a semiconductor device and a method for producing the same.

2. Description of the Related Art

FIGS. 10 and 11 illustrate a QFP (Quad Flat Package) semiconductor device 100, which is a typical IC package.

The semiconductor device 100 is formed by adhering a semiconductor element 104 into a die pad 102 with an adhesive, and connecting electrodes 108 of the semiconductor element 104 to Ag-plated electrodes 112 of lead frames 110 via wires 114.

The wires 114 are connected to the electrodes 108 of the semiconductor element 104 by ball bonding (first bonding) and to the Ag-plated electrodes 112 of the lead frames 110 by wedge bonding (second bonding).

The semiconductor element 104 and the wires 114 are enclosed in a sealing resin 116 for protection against external stresses and environmental conditions.

The rows of the electrodes 108 are disposed near each edge of the upper surface of the semiconductor element 104. Inner wires 114B, which bond inner electrodes 108B with the Ag-plated electrodes 112, and outer wires 114A, which bond outer electrodes 108A with the Ag-plated electrodes 112, are positioned at different heights.

Therefore, there is a risk that the inner wires 114B and the outer wires 114A may come into contact with each other. If the inner wires 114B and the outer wires 114A come into contact with each other, the semiconductor device may not function whereas signals for the respective electrodes 108 are different.

SUMMARY OF THE INVENTION

In view of the aforementioned problem, an object of the present invention is to provide a semiconductor device, wherein a member is placed between bonding wires to prevent the bonding wires from coming into contact with each other, and a method for producing the semiconductor device.

A first aspect of the present invention is a semiconductor device comprising a semiconductor element having arranged thereon rows of electrodes connected via bonding wires to electrodes of lead frames, wherein the bonding wires comprise inner bonding wires which connect to electrodes disposed at an inner side of the semiconductor element and outer bonding wires which connects to electrodes disposed at an outer side of the semiconductor element, and a member for preventing contact between the inner bonding wires and the outer bonding wires is placed on the outer bonding wires so as to be interposed between the inner bonding wires and the outer bonding wires.

Next, the operation and effects of the semiconductor device according to the first aspect are described.

The semiconductor device is provided with the inner bonding wires which connect to the electrodes disposed at the inner side of the semiconductor element and the outer bonding wires which connect to the electrodes disposed at the outer side of the semiconductor element. If the inner and outer bonding wires come into contact with each other, the semiconductor device will not function.

In the present invention, the contact prevention member is placed on the outer bonding wires so as to be interposed between the inner bonding wires and the outer bonding wires, thereby preventing the inner bonding wires and the outer bonding wires from coming into contact with each other.

Contact between the inner bonding wires and the outer bonding wires could also be prevented by providing a supporting rod between them. However, if the supporting rod is provided, a structure for fixing the supporting rod is necessary. This increases the number of production steps involved in as well as cost of producing the semiconductor device.

In the semiconductor device of the present invention, a looped contact prevention member is used instead of the supporting rod. The looped contact prevention member is stabilized merely by being placed on the outer bonding wires. Therefore, there is no need for an additional structure for fixing the contact prevention member, and increases in the number of required production steps and in production costs can be avoided.

The required strength of the outer bonding wires could present a problem since they support the contact prevention member placed thereon.

However, by forming the contact prevention member as a loop, the contact prevention member can be supported by all of the outer bonding wires when, for example, the outer bonding wires are connected to each side of the semiconductor element. Therefore, the load applied to each of the outer bonding wires is small. Thus, the required strength of the outer bonding wires can be kept from presenting a problem.

A second aspect of the present invention is a semiconductor device wherein the contact prevention member comprises a multiple loop structure and makes contact with each of the bonding wires at two or more points.

Accordingly, this structure effectively prevents the bonding wires from coming into contact with each other even when the lengths thereof are long.

A third aspect of the present invention is a semiconductor device wherein the contact prevention member has disposed on surfaces thereof protruding members for preventing mutually adjacent bonding wires from coming into contact with each other.

The protruding members formed on the contact prevention member function as guides for the wires and hold the bonding wires in their respective places. Thus, this structure prevents mutually adjacent bonding wires from coming into contact with each other.

Particularly, when a semiconductor package is sealed, the bonding wires may be pushed by a sealing resin. However, by providing the protruding members, the bonding wires can be held in their respective positions, thereby preventing mutually adjacent bonding wires from coming into contact with each other.

A fourth aspect of the present invention is a semiconductor device comprising: a semiconductor element having arranged thereon rows of electrodes; inner bonding wires for connecting electrodes disposed at an inner side of the semiconductor element and electrodes of lead frames; outer bonding wires for connecting electrodes disposed at an outer side of the semiconductor element and the electrodes of the lead frames; and a member for preventing contact between the bonding wires comprising a loop shaped base placed on the lead frames and a loop shaped supporting portion interposed between the inner bonding wires and the outer bonding wires, for supporting the inner bonding wires from below to suspend the semiconductor element and for preventing the inner bonding wires and the outer bonding wires from coming into contact with each other.

In the fourth aspect of the present invention, the contact prevention member is placed on the lead framed and on the outer bonding wires so as to be interposed between the inner bonding wires and the outer bonding wires, thereby preventing the inner bonding wires and the outer bonding wires from coming into contact with each other.

In a typical semiconductor device, a semiconductor element is disposed on a die pad in order to provide sufficient strength. However, if the die pad is provided, the semiconductor device must be thicker and this leads to an increase in the size of the semiconductor device.

If the size of the semiconductor device is increased, the size of an accommodating device, into which the semiconductor device is incorporated, must also be increased. This, in turn, increases the costs of producing the semiconductor device and the accommodating device.

In the present invention, the contact prevention member comprises the loop shaped base which is placed on the lead frames and the loop shaped supporting portion which support the inner bonding wires from below. Therefore, the semiconductor element is suspended via the inner bonding wires in this structure.

Since the supporting portion can support the weight of the semiconductor element and can also provide reinforcement, the die pad becomes unnecessary, allowing a die pad-less structure. As a result, the thickness of the semiconductor device can be reduced to make it smaller, and production costs thereof can also be reduced.

Further, the device for accommodating the semiconductor device can also be made smaller, and this allows reduction in the cost of producing the accommodating device.

A fifth aspect of the present invention is a semiconductor device wherein the supporting portion of the contact prevention member has a multiple loop structure and makes contact with each of the bonding wires at two or more points thereon.

Similarly to the second aspect of the present invention, this structure effectively prevents the bonding wires from coming into contact with each other even when the lengths thereof are long.

A sixth aspect of the present invention is a semiconductor device wherein the supporting portion of the contact prevention member comprises protruding members disposed on surfaces thereof for preventing mutually adjacent bonding wires from coming into contact with each other.

Similarly to the third aspect of the present invention, this structure prevents mutually adjacent bonding wires from coming into contact with each other.

A seventh aspect of the present invention is a method for producing a semiconductor device of any of the first to the third aspects, comprising the steps of bonding the electrodes disposed at the outer side of the semiconductor element and the electrodes of the lead frames via the outer bonding wires; placing the contact prevention member on the outer bonding wires; and bonding the electrodes disposed at the inner side of the semiconductor element and the electrodes of the lead frames via the inner bonding wires.

According to the method described above for producing a semiconductor device, placing the contact prevention member on the outer bonding wires prevents the inner bonding wires and the outer bonding wires from coming into contact with each other.

Moreover, the contact prevention member can be stabilized merely by being placed on the outer bonding wires and does not require formation of an additional mechanism for fixing it. Therefore, an increase in the number of production steps required to produce the semiconductor device can be avoided, along with the increases in production costs that additional production steps would entail.

An eighth aspect of the present invention is a method for producing a semiconductor device of any of the fourth to the sixth aspects, comprising the steps of placing the semiconductor element and the lead frames directly on a bonding stage; bonding the electrodes disposed at the outer side of the semiconductor element and the electrodes of the lead frames via the outer bonding wires; placing the contact prevention member on the lead frames and the outer bonding wires; and bonding the electrodes disposed at the inner side of the semiconductor element and the electrodes of the lead frames via the inner bonding wires.

According to the method described above for producing a semiconductor device, placing the contact prevention member on the lead frames and on the outer bonding wires prevents the inner bonding wires and the outer bonding wires from coming into contact with each other.

Furthermore, the semiconductor element and the lead frames are placed directly on the bonding stage in the first production step, and there is no need for a die pad. A step for placing the die pad on the bonding stage can therefore be omitted, and the production process can be simplified.

Moreover, the semiconductor device produced according to the production method of the present aspect is thinner than a typical semiconductor device by the thickness of the omitted die pad. Therefore, the size of the semiconductor device, as well as production costs thereof, can be reduced.

A ninth aspect of the present invention is a semiconductor device comprising: a semiconductor element mounted on a die pad and including a surface having a central area and a peripheral area surrounding the central area; first electrodes disposed at the peripheral area; second electrodes disposed at the central area; first bonding wires for respectively connecting the first electrodes and first lead frames; second bonding wires for respectively connecting the second electrodes and second lead frames; and a loop shaped insulative member placed on the first bonding wires and under the second bonding wires and supported by the first bonding wires.

A tenth aspect of the present invention is a method for producing semiconductor device comprising: a semiconductor element including a surface having a central area and a peripheral area surrounding the central area; first electrodes disposed at the peripheral area; second electrodes disposed at the central area; first bonding wires for respectively connecting the first electrodes and first lead frames; second bonding wires for respectively connecting the second electrodes and second lead frames; and a fixing member comprising a loop shaped base placed on the first and the second lead frames and a loop shaped supporting portion connected to the base and placed on the first bonding wires and under the second bonding wires; wherein the semiconductor element is supported by the fixing member and the first and the second lead frames.

An eleventh aspect of the present invention is a method for producing a semiconductor device having a semiconductor element which includes on a surface thereof a central area and a peripheral area surrounding the central area; first electrodes disposed at the peripheral area; second electrodes disposed at the central area; first lead frames respectively and electrically connected to the first electrodes via first bonding wires; and second lead frames respectively and electrically connected to the second electrodes via second bonding wires; comprising the steps of: fixing the semiconductor element on a die pad; bonding the first electrodes and the first lead frames via the first bonding wires after fixing the semiconductor element; placing and supporting a loop shaped insulative member, which has a perimeter longer than a perimeter of the semiconductor element, on the first bonding wires; and bonding the second electrodes and the second lead frames via the second bonding wires which pass above the insulative member.

A twelfth aspect of the present invention is a method for producing a semiconductor device having a semiconductor element which includes on a surface thereof a central area and a peripheral area surrounding the central area; first electrodes disposed at the peripheral area; second electrodes disposed at the central area; first lead frames respectively and electrically connected to the first electrodes via first bonding wires; and second lead frames respectively and electrically connected to the second electrodes via second bonding wires; comprising the steps of: placing the semiconductor element and the first and the second lead frames on an upper surface of a bonding stage; bonding the first electrodes and the first lead frames via the first bonding wires; placing a fixing member which comprises a loop shaped base having a perimeter reaching the first and the second lead frames, and a loop shaped supporting portion connected to the base and having a perimeter which is shorter than that of the base and longer than that of the semiconductor element, such that the base is placed on the first lead frames and the supporting portion is placed on the first bonding wires, and supporting the fixing member with the first lead frames and the first bonding wires; and bonding the second electrodes and the second lead frames via the second bonding wires which pass above the fixing member.

BRIEF DESCRIPTION OF THE DRAWINGS

FIG. 5 is a structural view of a semiconductor device according to a second embodiment of the present invention.

DESCRIPTION OF THE PREFERRED EMBODIMENTS

A semiconductor device according to a first embodiment of the present invention will now be described with reference to the appended drawings.

Figure 1:
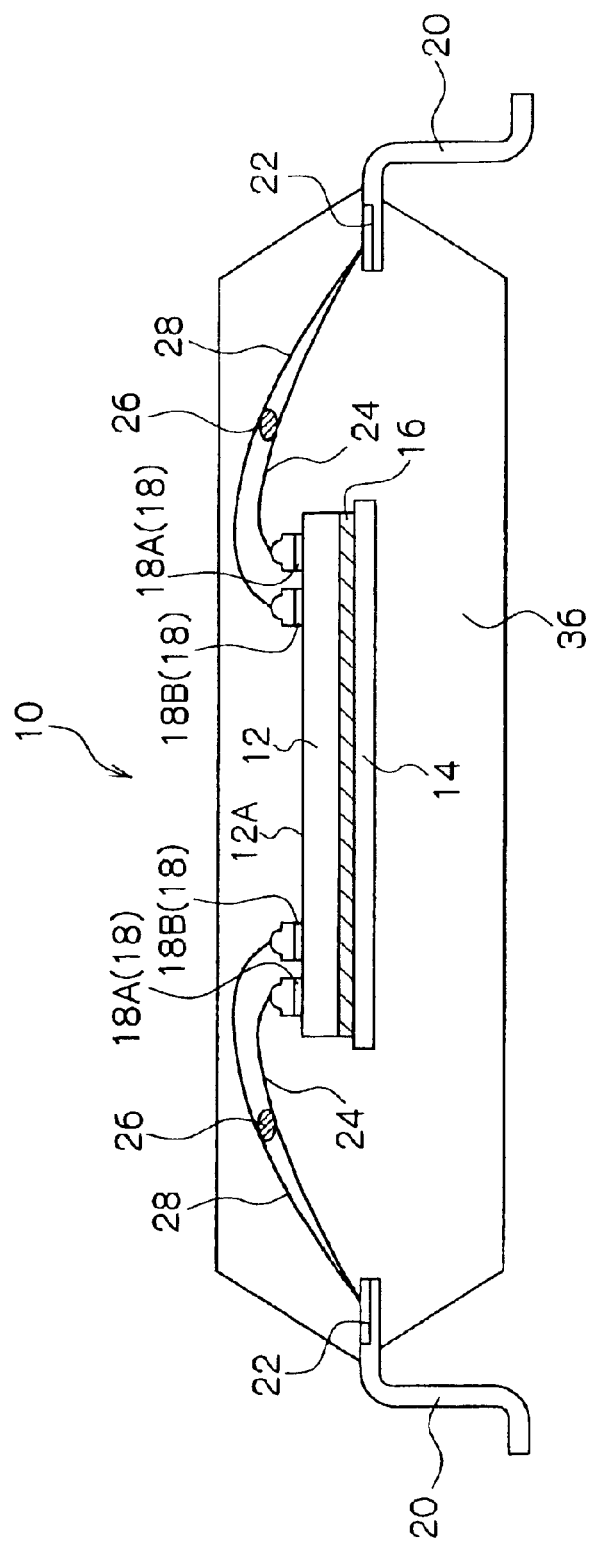
FIG. 1 is a structural view of a semiconductor device according to a first embodiment of the present invention.
Figure 2:
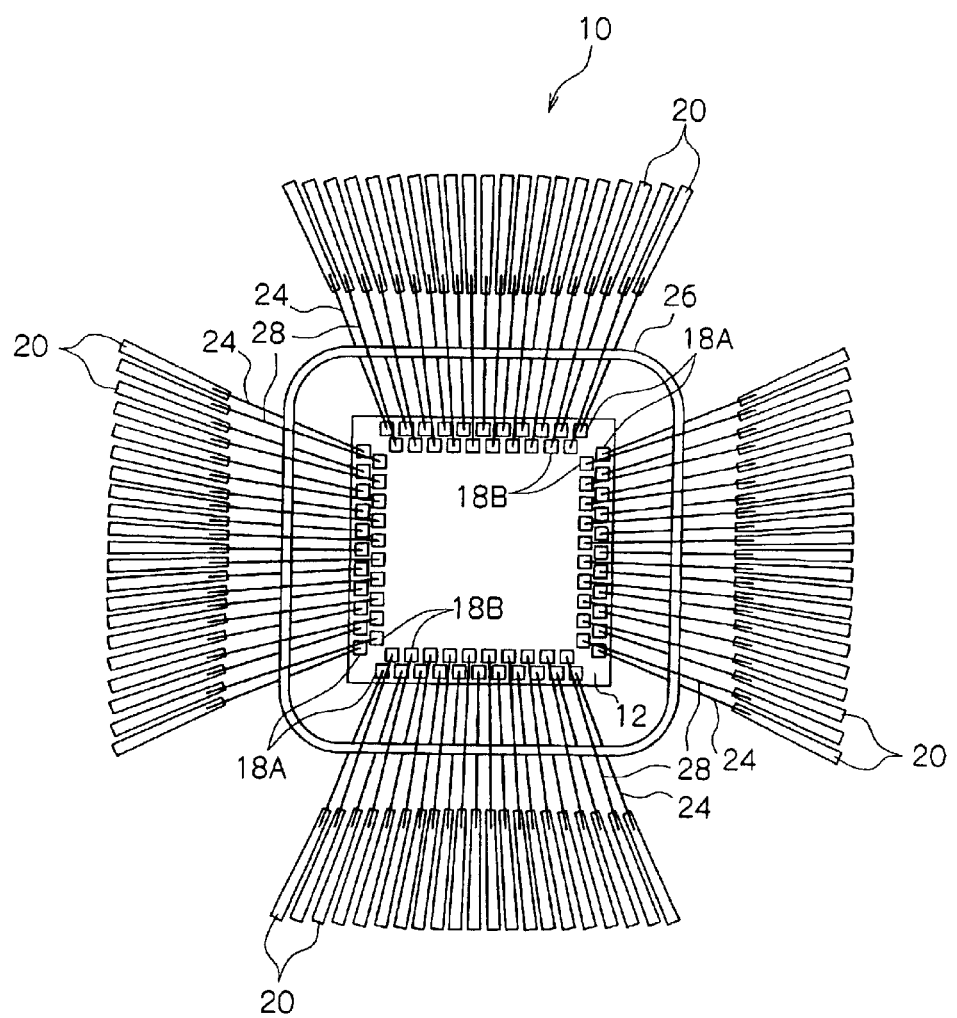
FIG. 2 is a plan view of the semiconductor device according to the first embodiment of the present invention.

As shown in FIGS. 1 and 2, a semiconductor device 10 is disposed with a square-shaped semiconductor element 12. The semiconductor element 12 is fixed to a die pad 14 with an adhesive 16.

Electrodes 18 are disposed on an upper surface 12A of the semiconductor element 12, forming two rows along each side thereof.

Although chips have been made increasingly smaller in order to reduce costs or decrease the area required for mounting, the size of the electrodes 18 on the semiconductor element 12 cannot be further reduced due to current limitations in bonding techniques. Therefore, whereas electrodes have conventionally been arranged in single rows, the electrodes 18 can be arranged on the smaller semiconductor element 12, without altering the size of the electrodes 18, by forming tow or more rows along each side thereof.

For convenience of explanation, the electrodes 18 positioned in outer rows are hereinafter referred to as outer semiconductor electrodes 18A, while those of inner rows are hereinafter referred to as inner semiconductor electrodes 18B.

It should be noted that, although the electrodes 18 are arranged in two rows along each side of the upper surface 12A in the present embodiment, this is not intended to limit the present invention. The electrodes may be arranged in several rows (e.g., three rows, four rows, etc.) along the sides of the upper surface of the semiconductor element.

The semiconductor device 10 is provided with lead frames 20.

The outer semiconductor electrodes 18A (first electrodes) and lead electrodes 22 of the lead frames 20 (first lead frames) are respectively bonded via outer wires 24 (first bonding wires). Therefore, the outer wires 24 are positioned side by side at each side of the semiconductor element 12.

A member 26 for preventing contact between bonding wires, hereinafter contact prevention member 26, is placed on the outer wires 24. The contact prevention member 26 is placed so as to make contact with the outer wires 24 at substantially central areas thereof.

The contact prevention member 26 is thin and generally square-shaped when viewed from above.

However, the shape of the contact prevention member 26 is not limited to that of a square, and it may, for example, be circular.

In the present embodiment, the contact prevention member 26 must be light since it is placed on the outer wires 24. Specifically, it is preferable that a withstand load per wire be about 4 g. In other words, the weight of the contact prevention member 26 to be placed on the outer wires 24 is preferably less than or equal to that obtained by multiplying 4 g by the total number of the outer wires 24. For example, if there are 200 wires, a withstand load of the outer wires 24 is about 800 g. Therefore, it is preferable that the total weight of the contact prevention member 26 be less than or equal to about 800 g. In light of this consideration, the contact prevention member 26 of the present invention is preferably made of an insulative material, such as an epoxy material, a polyimide material, or the like. By forming the contact prevention member 26 with such a material, it can be easily formed using a die forming process, and production costs thereof can be suppressed.

Further, the inner semiconductor electrodes 18B (second electrodes) and lead electrodes 22 of the lead frames 20 (second lead frames) are respectively bonded via inner wires 28 (second bonding wires) which pass above the contact prevention member 26. Therefore, the inner wires 28 are also positioned side by side at each side of the semiconductor element 12.

The inner wires 28 are positioned higher than the outer wires 24.

Figure 3:
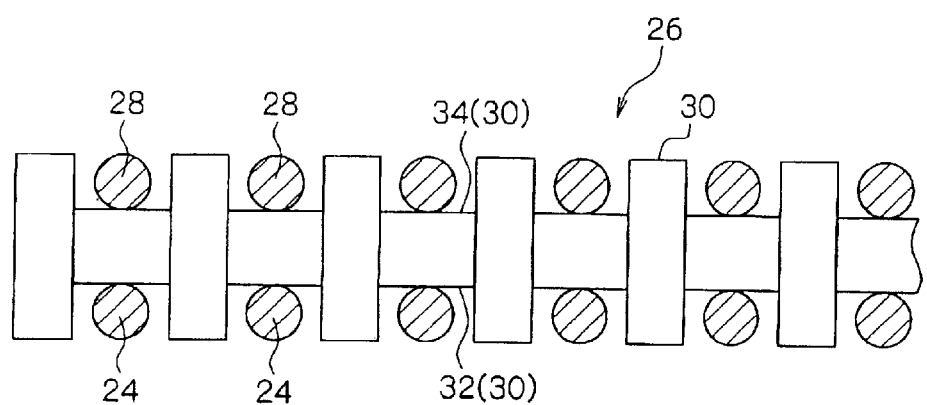
FIG. 3 is a partial side view of a contact prevention member included in the semiconductor device according to the first embodiment of the present invention.

As shown in FIG. 3, protruding members 30 are disposed at intervals along upper and lower surfaces of the contact prevention member 26 such as to form a crenellated pattern when viewed from the side.

The protruding members 30 of the contact prevention member 26 are formed of an epoxy material, a polyimide material, or the like via die forming.

Spaces are thus created between mutually adjacent protruding members 30 at both the upper and lower surfaces of the contact prevention member 26. Spaces 32 at the lower side (outer wires 24 side) of the contact prevention member 26 receive the outer wires 24 and spaces 34 at the upper side (inner wires 28 side) of the contact prevention member 26 receive the inner wires 28.

As described above, the contact prevention member 26 is interposed between the outer wires 24 and the inner wires 28, thereby preventing the outer wires 24 and the inner wires 28 from coming into contact with each other.

In addition, the semiconductor element 12, the outer wires 24, the inner wires 28, the die pad 14, and portions of the lead frames 20 are enclosed in a sealing resin 36, thereby protecting the semiconductor element 12 from external stress, and the like.

A method for producing the semiconductor device 10 will now be described.

Figure 4A:
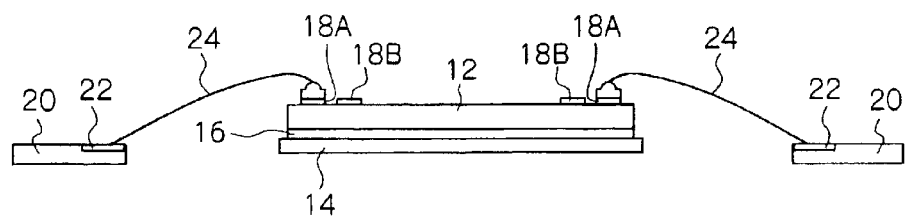
FIGS. 4A–4C are views illustrating steps included in a method for producing the semiconductor device according to the first embodiment of the present invention.

First, as shown in FIG. 4A, the semiconductor element 12 is attached to the die pad 14 with the adhesive 16.

Then, the outer semiconductor electrodes 18A and the lead electrodes 22 of the lead frames 20 are respectively bonded via the outer wires 24.

Figure 4B:
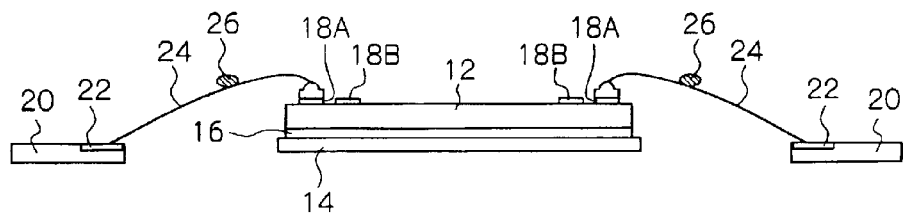

As shown in FIG. 4B, the contact prevention member 26 is subsequently placed on the bonded outer wires 24 at substantially intermediate positions along the lengths thereof. Such positioning of the contact prevention member 26 at the substantial midpoints of the outer wires 24 is preferable since any change in position of the bonding wires, due to the inflow of the sealing resin 36 at the time the mold is sealed, will be greatest near the midpoints of the wires.

The contact prevention member 26 can be provided without lowering productivity by using a mechanism in which a mounting unit is attached to a wire bonder. When the mounting unit receives a trigger signal from the bonder, the contact prevention member 26 is automatically mounted under the control of a sequencer.

Figure 4C:
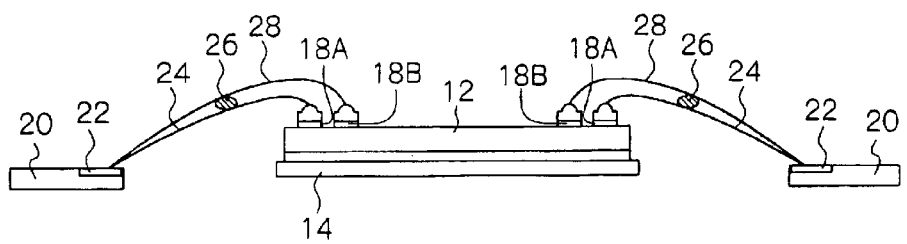

Next, as shown in FIG. 4C, the inner semiconductor electrodes 18B and the lead electrodes 22 of the lead frames 20 are respectively bonded via the inner wires 28 which pass over the contact prevention member 26.

Then, the sealing resin 36 is provided to enclose the whole semiconductor device 10 except for portions of the lead frames 20.

Thereafter, the lead frames 20 are bent by a pressing machine (not shown) to complete the semiconductor device 10.

As described above, in the semiconductor device 10 of the present embodiment, the contact prevention member 26 is interposed between the outer wires 24 and the inner wires 28 and prevents the outer wires 24 and the inner wires 28 from coming into contact with each other. Thus, malfunction of the semiconductor device 10 resulting from contact between these wires can be prevented.

Further, the protruding members 30 are formed on the surfaces of the contact prevention member 26, and each of the resulting spaces 32 and 34 receives one of the outer wires 24 or the inner wires 28. This prevents the outer wires 24 and the inner wires 28 from changing position in relation to the contact prevention member 26.

Thus, contact between mutually adjacent outer wires 24 and between mutually adjacent inner wires 28 can be prevented, thereby preventing malfunction of the semiconductor device 10 resulting from contact between these wires.

Particularly at the time when the package is sealed with the sealing resin 36, the outer wires 24 and the inner wires 28 may be pressed by the inflow of the sealing resin 36. Even when this occurs, however, change in position of the outer wires 24 and the inner wires 28 can be prevented, whereby contact between mutually adjacent outer wires 24 and between mutually adjacent inner wires 28 can be prevented as well.

Although contact between the outer wires 24 and the inner wires 28 can also be prevented by interposing a rod-like contact prevention member between the outer wires 24 and the inner wires 28, this presents the difficulty involved with fixing the rod-like contact prevention member within the semiconductor device.

Specifically, when the rod-like contact prevention member is used, a special mechanism (not shown) is required for positioning the contact prevention member between the outer and inner wires. This increases the required number of production steps as well as the size of the semiconductor device and results in increased production costs.

Since the semiconductor device 10 of the present invention uses the looped contact prevention member 26, which is stabilized at its position by and on the outer wires 24, there is no need for the special positioning mechanism.

Therefore, increases in the number of production steps, the size of the semiconductor device, and the cost of production can be avoided.

One might think that the required strength of the outer wires 24, which support the weight of the contact prevention member 26 placed thereon, could present a problem. However, since there are many of the outer wires 24 connected to each side of the semiconductor element 12 and since the contact prevention member 26 is supported by all of the outer wires 24, the load supported by each wire is small and thus the required strength of the wired does not present a problem.

Next, a semiconductor device according to a second embodiment of the present invention will be described.

The difference between the semiconductor device of the present embodiment and the semiconductor device 10 of the first embodiment lies only in the structure of the contact prevention member. Therefore, the parts which are common to both embodiments are referred to using the same reference numerals, and explanations thereof may be omitted.

Figure 6:
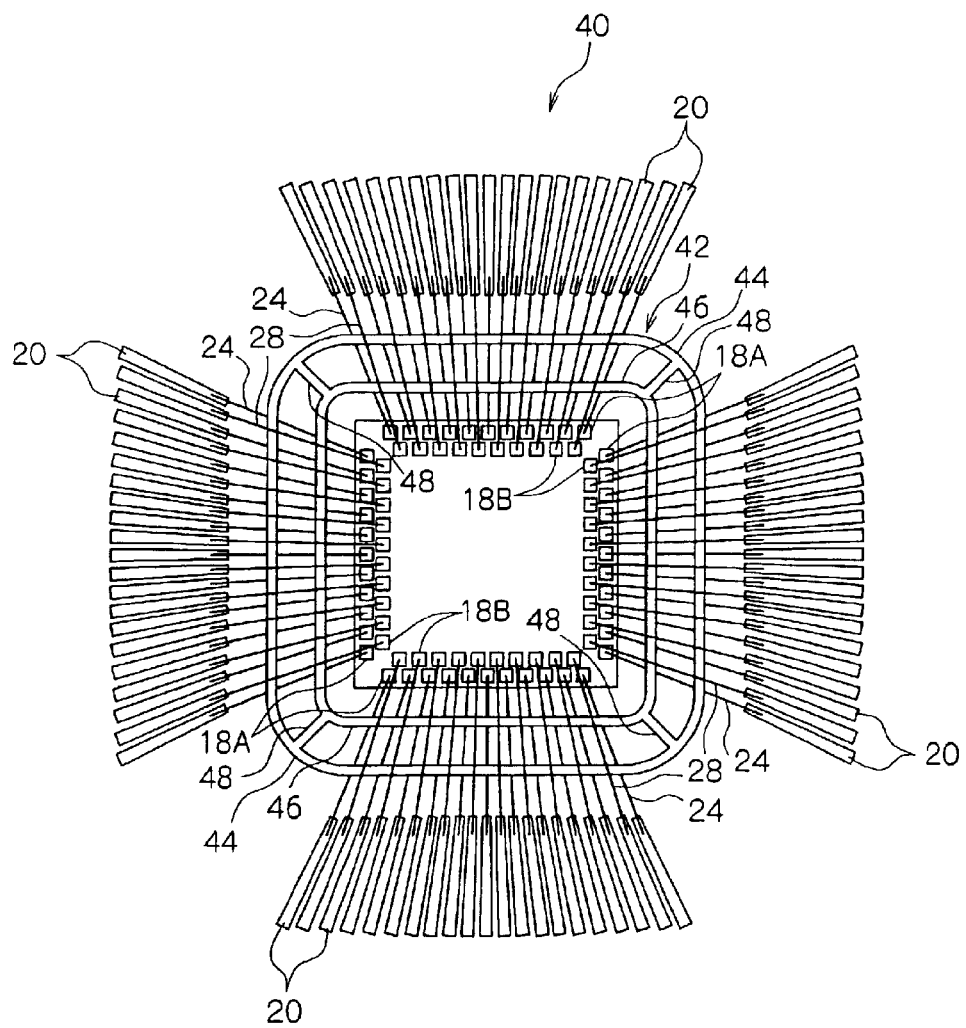
FIG. 6 is a plan view of the semiconductor device according to the second embodiment of the present invention.

As shown in FIGS. 5 and 6, a contact prevention member 42 included in a semiconductor device 40 of the present embodiment comprises an outer loop 44.

The outer loop 44 is thin and generally square-shaped when viewed from above. The outer loop 44 is placed on the outer wires 24 at a position near the lead frames 20.

An inner loop 46, which is located inside the outer loop 44 (i.e., toward the semiconductor element 12), is connected to the outer loop 44 via four bridges 48.

The inner loop 46 is also thin and generally square-shaped when viewed from above. The inner loop 46 is placed on the outer wires 24 at a position substantially between the outer loop 44 and the semiconductor element 12.

In the present embodiment, the outer loop 44 is disposed on the outer wires 24 at a position about 300 µm from ends of the lead frames 20, and the inner loop 46 is positioned at substantially intermediate positions along the lengths of the outer wires 24. Such positioning of the inner loop 46 at the substantial midpoints of the outer wires 24 is preferable since any change in position of the bonding wires, due to the inflow of the sealing resin 36 at the time the mold is sealed, will be greatest near the midpoints of the wires. By using the dual loop contact prevention member 42 with the outer loop 44 positioned as described above, the second embodiment is also particularly effective at preventing mutually adjacent wires from coming into contact with each other near the lead frames 20 when the mold resin is injected.

The contact prevention member 42 is formed so that the inner loop 46 is positioned higher than the outer loop 44.

It should be noted that, although the dual loop contact prevention member 42 is used in the semiconductor device 40 of the present embodiment, this is not intended to limit the present invention. The contact prevention member is preferably formed having a greater number of loops (e.g., three, four, or any suitable number) depending on the lengths of the outer wires 24.

In the semiconductor device 40 of the present embodiment, the contact prevention member 42 comes in contact with each outer wire 24 at two positions thereon. Therefore, contact between the outer wires 24 and the inner wires 28 can be effectively prevented even when the outer wires 24 and the inner wires 28 are long.

Although the contact prevention member 26 and the contact prevention member 42 are used respectively in the semiconductor device 10 of the first embodiment and the semiconductor device 40 of the second embodiment, these are not intended to limit the present invention.

For example, a fabric-like protective sheet (not shown) may be disposed between the outer wires 24 and the inner wires 28. The protective sheet is preferably made of an insulative material having a thickness of about 20–50 µm. A material such as a polyimide material is suitable.

The desired semiconductor device 40 can be obtained without lowering productivity by using a mechanism in which a mounting unit is attached to a wire bonder. When the mounting unit receives a trigger signal from the bonder, the protective sheet is automatically mounted under the control of a sequencer.

When the contact prevention member 26 or 42 is used, the contact prevention member makes contact with each of the outer wires 24 at one or more points along the length thereof. When the insulative sheet is used, however, the contact area between the insulative sheet and the outer wires 24 can be increased by making the area of the insulative sheet as large as possible. Therefore, contact between the outer wires 24 and the inner wires 28 can be prevented much more effectively.

In other words, in the present embodiment, the insulative sheet is laid on the outer wires 24 so that a lower surface of the insulative sheet makes contact with the outer wires 24 and an upper surface of the insulative sheet makes contact with the inner wires 28, thereby preventing contact between the outer wires 24 and the inner wires 28.

Furthermore, by making the outer wires 24 dig into the lower surface of the insulative sheet and making the inner wires 28 dig into the upper surface of the insulative sheet, contact between mutually adjacent outer wires 24 and between mutually adjacent inner wires 28 can also be prevented.

Next, a semiconductor device according to a third embodiment of the present invention will be described.

The main difference between the semiconductor device of the present embodiment and the semiconductor device 10 of the first embodiment lies in the structure of the contact prevention member. This difference in structure, moreover, allows the construction of a semiconductor device in which the use of a die pad is unnecessary.

Note that the parts which are common to both embodiments are referred to using the same reference numerals, and explanations thereof may be omitted.

Figure 7:
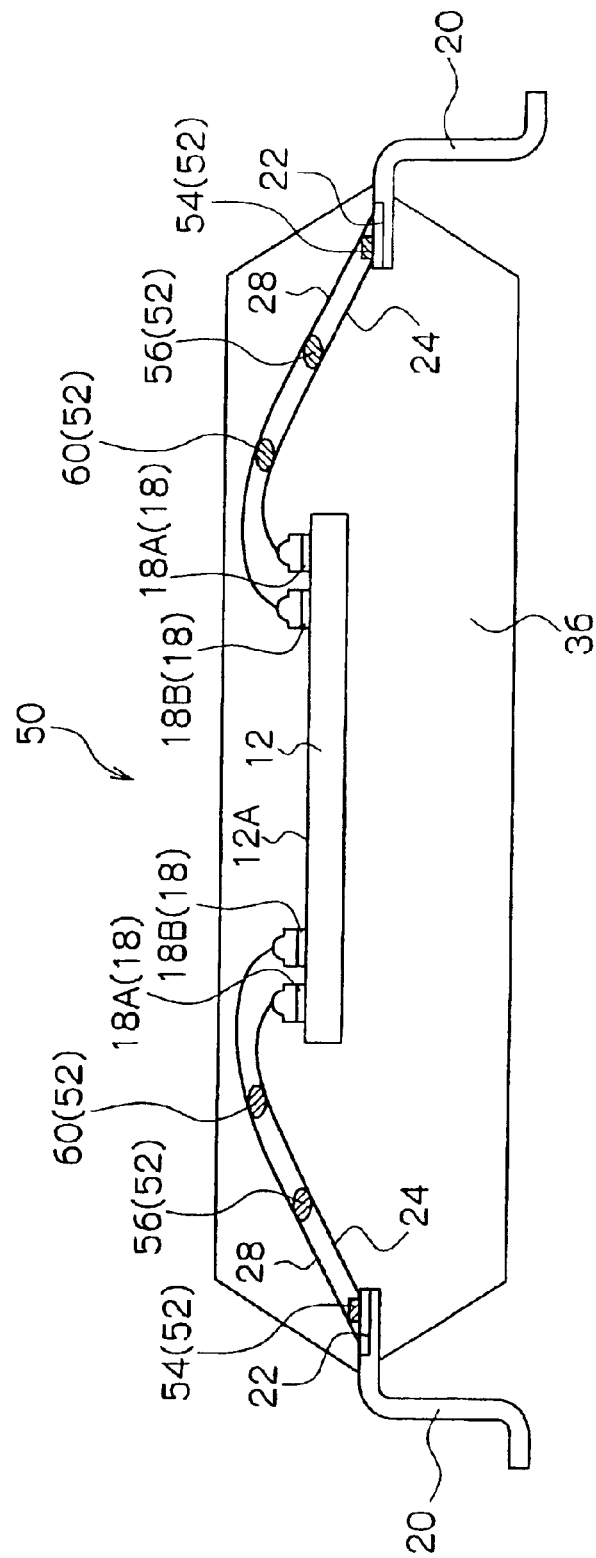
FIG. 7 is a structural view of a semiconductor device according to a third embodiment of the present invention.
Figure 8:
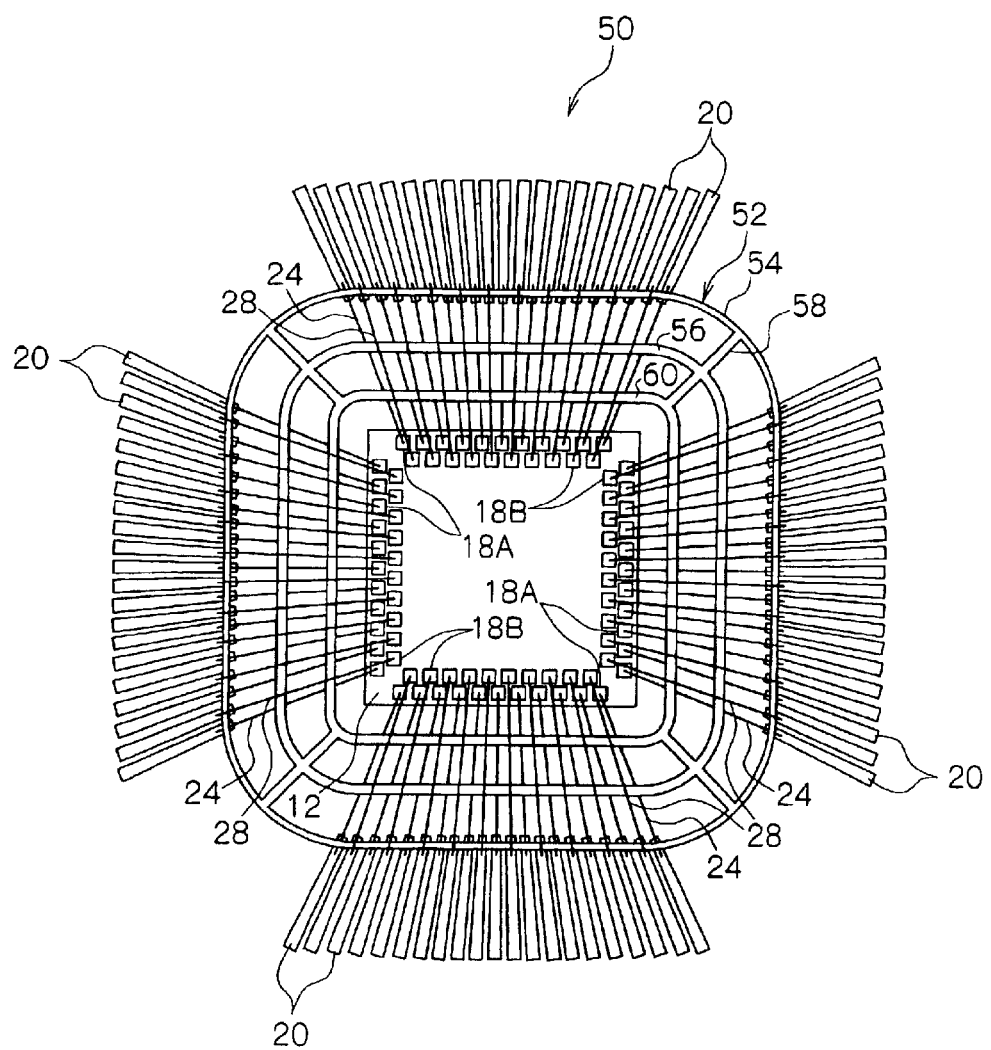
FIG. 8 is a plan view of the semiconductor device according to the third embodiment of the present invention.

As shown in FIGS. 7 and 8, a contact prevention member 52 used in a semiconductor device 50 of the present embodiment comprises a base loop 54 which is located at the outermost portion of the contact prevention member 52. The base loop 54 is placed on the lead frames 20.

An intermediate support loop 56, which is located inside the base loop 54, is connected to the base loop 54 via four bridges 58. The intermediate support loop 56 is placed on the outer wires 24 at a position near the lead frames 20.

Further, an inner support loop 60, which is located inside the intermediate support loop 56, is connected via the four bridges 58 to the intermediate support loop 56. The inner support loop 60 is placed on the outer wires 24 at a position substantially between the intermediate support loop 56 and the semiconductor element 12.

As described above, the contact prevention member 52 used in the semiconductor device 50 of the present embodiment has a triple loop structure comprising the base loop 54, the intermediate support loop 56, and the inner support loop 60.

The contact prevention member 52 is formed so that the intermediate support loop 56 is positioned higher than the base loop 54, and the inner support loop 60 is positioned higher than the intermediate support loop 56.

It should be noted that the structure of the contact prevention member 52 is not limited to the triple loop structure, and the contact prevention member may be formed having any number of loops which is suitable to the lengths of the outer wires 24.

In the semiconductor device 50 of the present embodiment, the base loop 54 is placed on the lead frames 20, and the inner wires 28 are supported from below by the intermediate support loop 56 and the inner support loop 60, which are placed on the outer wires 24. The semiconductor element 12 is then suspended from the contact prevention member 52 via the inner wires 28. As a result, there is no need for the die pad 14, which is used in the semiconductor device 10 of the first embodiment.

Further, similarly to the contact prevention member 26 of the semiconductor device 10 of the first embodiment, the protruding members 30 are disposed at intervals along upper and lower surfaces of the intermediate support loop 56 and the inner support loop 60. Each of the resulting spaces 32 receives one of the outer wires 24, and each of the resulting spaces 34 receives one of the inner wires 28, thereby preventing contact between mutually adjacent outer wires 24 and between mutually adjacent inner wires 28.

Next, a method for producing the semiconductor device 50 of the present embodiment will be described.

Figure 9A:
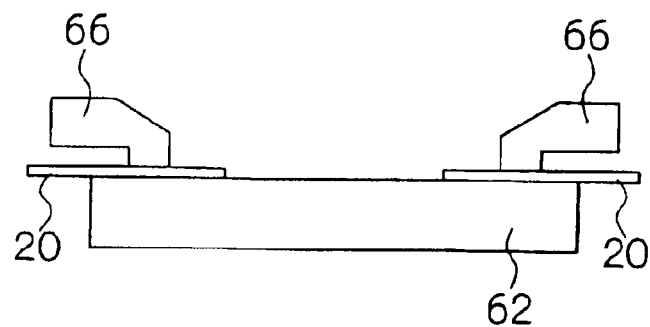
FIGS. 9A–9F are views illustrating steps included in a method for producing the semiconductor device according to the third embodiment of the present invention.

First, as shown in FIG. 9A, the lead frames 20 are provided on a bonding stage 62 in a machine for bonding wires (not shown). The lead frames 20 are clamped onto the bonding stage 62 by dampers 66.

Figure 9B:
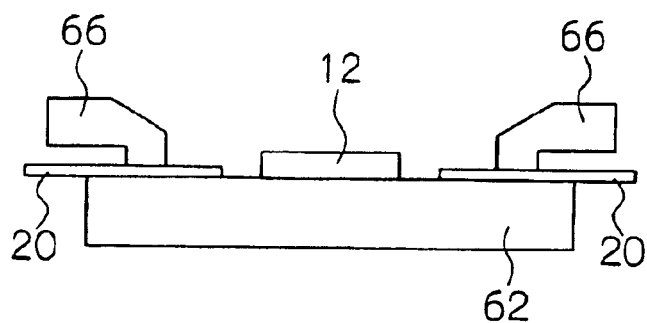

Then, as shown in FIG. 9B, the semiconductor element 12 is provided on the bonding stage 62.

In the case of a conventional semiconductor device, a die pad is provided at this point. However, since a die pad is unnecessary in the semiconductor device 50 of the present embodiment, no die pad is provided on the bonding stage 62.

Figure 9C:
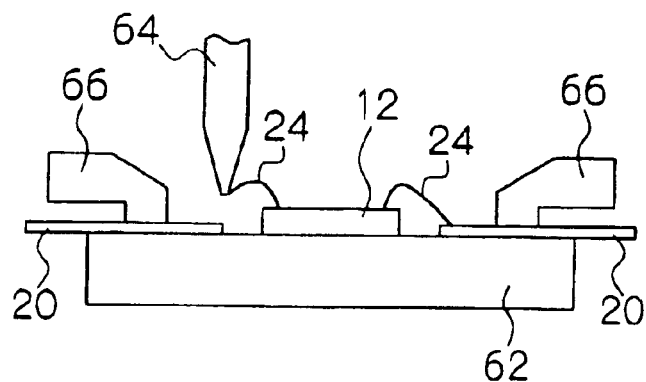

Subsequently, as shown in FIG. 9C, the outer semiconductor electrodes 18A (not shown in FIGS. 9A–9F) and the lead electrodes (not shown) of the lead frames 20 are respectively bonded via the outer wires 24. The bonding is carried out using a capillary 64.

Figure 9D:
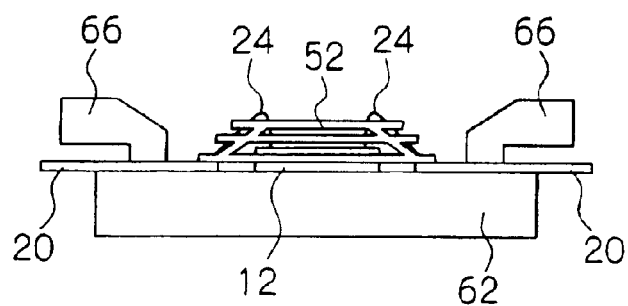

Then, as shown in FIG. 9D, the contact prevention member 52 is placed on the outer wires 24.

At this point, the base loop 54 of the contact prevention member 52 is placed on the lead frames 20, the intermediate support loop 56 is placed on the outer wires 24 near the lead frames 20, and the inner support loop 60 is placed on the outer wires 24 between the semiconductor element 12 and the intermediate support loop 56.

The contact prevention member 52 is placed so that each of the spaces 32 between mutually adjacent protruding members 30 formed on the lower surfaces of the intermediate support loop 56 and the inner support loop 60 receives only one of the outer wires 24.

Figure 9E:
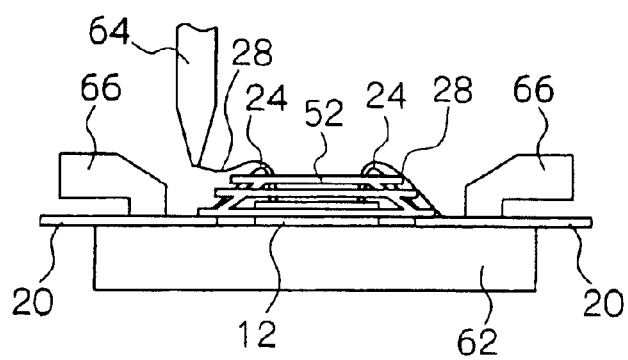

Next, as shown in FIG. 9E, the inner semiconductor electrodes 18B (not shown) and the lead electrodes (not shown) of the lead frames 20 are respectively bonded via the inner wires 28. The bonding is carried out using the capillary 64.

At this point, the bonding is carried out so that each of the spaces 34 between mutually adjacent protruding members 30 formed on the upper surfaces of the intermediate support loop 56 and the inner support loop 60 receives only one of the inner wires 28.

Figure 9F:
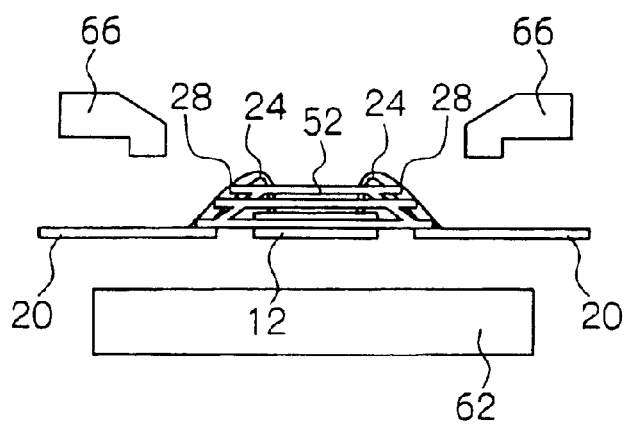
Figure 10:
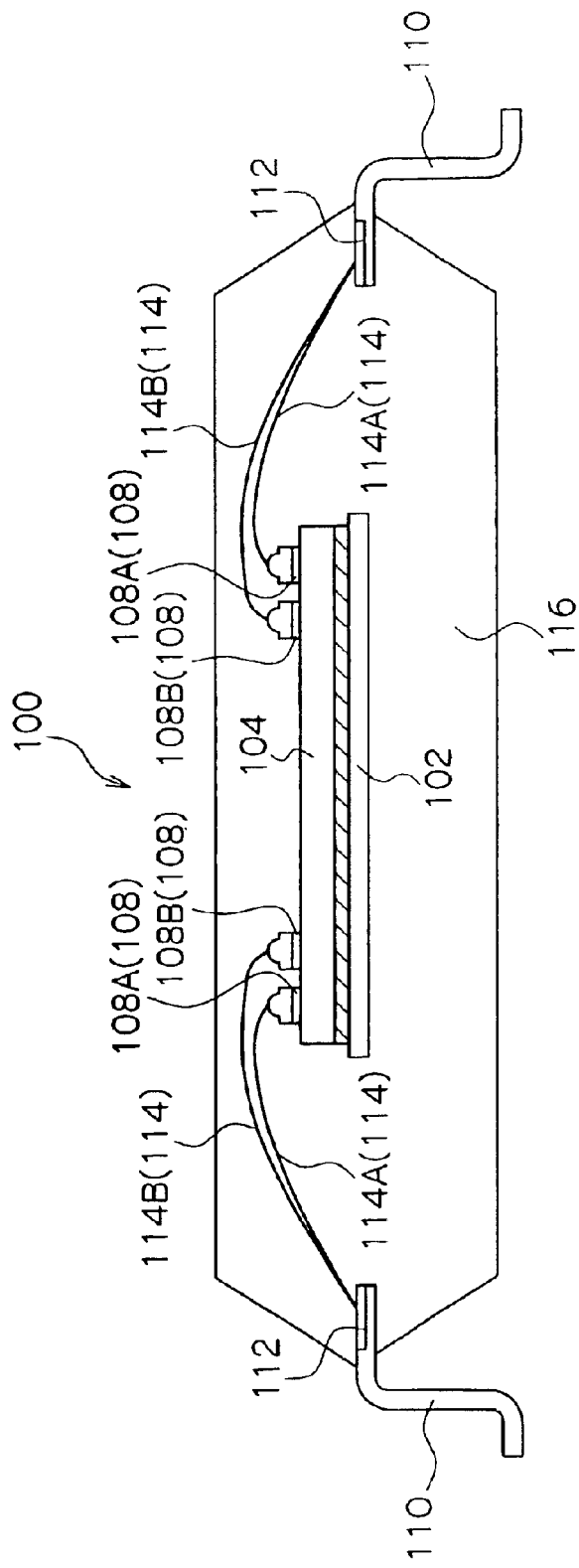
FIG. 10 is a structural view of a conventional semiconductor device.
Figure 11:
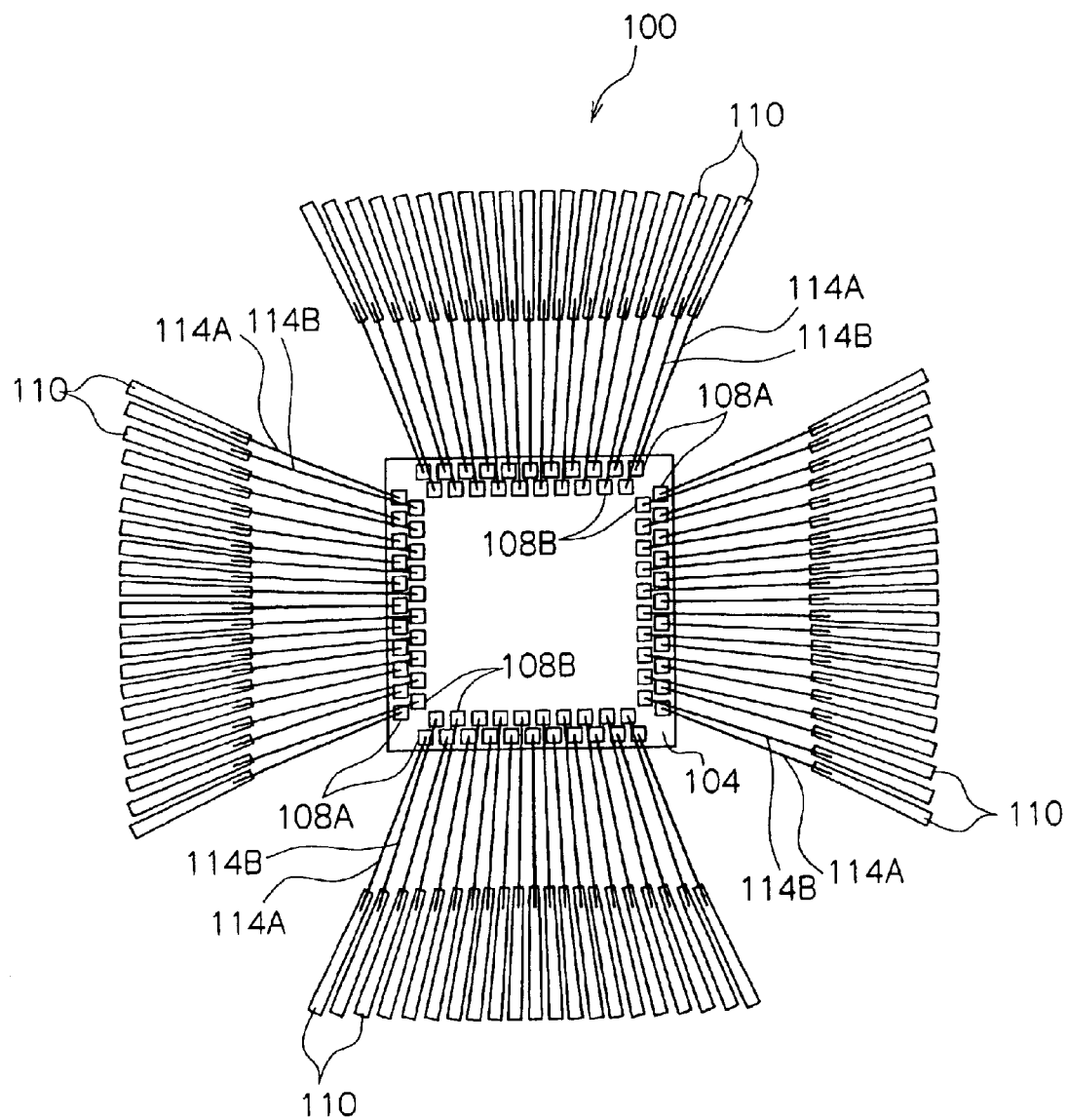
FIG. 11 is a plan view of the conventional semiconductor device.

Next, as shown in FIG. 9F, the semiconductor element 12 to which the outer wires 24 and the inner wires 28 are bonded is removed from the bonding stage 62. At this point, the semiconductor element 12 is suspended from the contact prevention member 52 via the inner wires 28.

Ordinarily, the semiconductor element may be pushed by the resin injected at the time of molding and may not be positioned properly. This may then cause problems such as a short circuit between the wires and the edges of the semiconductor element. In the present embodiment, however, the contact prevention member 52 being interposed between the outer wires 24 and the inner wires 28 serves to maintain alignment and positioning of the semiconductor element 12 in relation to the wires. Moreover, since the contact prevention member 52 includes the base loop 54 which is mounted on the lead frames 20, it is possible to maintain proper positioning of the semiconductor element 12 even more effectively. That is, in the present embodiment, since the lead frames 20 under the base loop 54 support the contact prevention member 52 against the downward pressure of the resin on the semiconductor element 12, the semiconductor element 12 is fixed in position without moving downward.

After the semiconductor element 12 is removed from the bonding stage 62, the sealing resin 36 is provided to enclose the whole semiconductor device 50 except for portions of the lead frames 20 (see FIG. 7).

Finally, the lead frames 20 are bent by a pressing machine (not shown) to complete the semiconductor device 50.

As described above, in the semiconductor device 50 of the present embodiment, and in a similar manner as in the semiconductor device 10 of the first embodiment, the contact prevention member 52 being interposed between the outer wires 24 and the inner wires 28 prevents the outer wires 24 and the inner wires 28 from coming into contact with each other.

At the same time, since the semiconductor element 12 in the present embodiment is suspended from the contact prevention member 52 comprising the base loop 54 which is placed on the lead frames 20, use of a die pad becomes unnecessary. Therefore, the semiconductor device 50 can be made thinner and smaller than the semiconductor device 10 of the first embodiment which is provided with the die pad 14. This allows a reduction in the cost of producing the semiconductor device 50.

Further, as the size of the semiconductor device 50 is reduced, the size of a device (not shown) for accommodating the semiconductor device 50 can also be reduced, which, in turn, reduces production costs of the accommodating device.

What is claimed is:

1. A semiconductor device comprising a semiconductor element having arranged thereon rows of electrodes connected via bonding wires to electrodes of lead frames, wherein the bonding wires comprise inner bonding wires which connect to electrodes disposed at an inner side of the semiconductor element and outer bonding wires which connect to electrodes disposed at an outer side of the semiconductor element, and a loop shaped contact prevention member that prevents contact between the inner bonding wires and the outer bonding wires, the contact prevention member being placed on the outer bonding wires so as to be interposed between the inner bonding wires and the outer bonding wires.

2. The semiconductor device of claim 1, wherein the contact prevention member comprises a multiple loop structure and makes contact with each of the bonding wires at two or more points.

3. The semiconductor device of claim 1, wherein the contact prevention member has disposed on surfaces thereof protruding members for preventing mutually adjacent bonding wires from coming into contact with each other.

4. The semiconductor device of claim 1, wherein the contact prevention member extends around an entire periphery of the semiconductor element.

5. A semiconductor device comprising:

a semiconductor element having arranged thereon rows of electrodes;

inner bonding wires for connecting electrodes disposed at an inner side of the semiconductor element and electrodes of lead frames;

outer bonding wires for connecting electrodes disposed at an outer side of the semiconductor element and the electrodes of the lead frames; and a contact prevention member for preventing contact between the bonding wires, the contact prevention member comprising a loop shaped base placed on the lead frames, and a loop shaped supporting portion disposed on the outer bonding wires and interposed between the inner bonding wires and the outer bonding wires, which supports the inner bonding wires from below, suspends the semiconductor element and prevents the inner bonding wires and the outer bonding wires from coming into contact with each other.

6. The semiconductor device of claim 5, wherein the supporting portion of the contact prevention member has a multiple loop structure and makes contact with each of the bonding wires at two or more points thereon.

7. The semiconductor device of claim 5, wherein the supporting portion of the contact prevention member comprises protruding members disposed on surfaces thereof for preventing mutually adjacent bonding wires from coming into contact with each other.

8. The semiconductor device of claim 5, wherein the contact prevention member extends around an entire periphery of the semiconductor element.

9. A semiconductor device comprising:
   a semiconductor element mounted on a die pad and including a surface having a central area and a peripheral area surrounding the central area;
   first electrodes disposed at the peripheral area:
   second electrodes disposed at the central area;
   first bonding wires for respectively connecting the first electrodes and first lead frames;
   second bonding wires for respectively connecting the second electrodes and second lead frames; and
   a loop shaped insulative member placed on the first bonding wires and under the second bonding wires and supported by the first bonding wires.

10. The semiconductor device of claim 9, wherein the insulative member comprises multiple loops and makes contact with each of the first bonding wires and each of the second bonding wires at two or more points thereon.

11. The semiconductor device of claim 9, wherein the insulative member prevents the first bonding wires and the second bonding wires from coming into contact with each other.

12. The semiconductor device of claim 9, wherein the insulative member comprises depressions formed at surfaces thereof, and the first bonding wires and the second bonding wires are respectively placed in the depressions.

13. The semiconductor device of claim 12, wherein the depressions prevent contact between mutually adjacent first bonding wires and between mutually adjacent second bonding wires.

14. The semiconductor device of claim 9, wherein the insulative member extends around an entire periphery of the semiconductor element.

15. A semiconductor device comprising:
   a semiconductor element including a surface having a central area and a peripheral area surrounding the central area;
   first electrodes disposed at the peripheral area;
   second electrodes disposed at the central area;
   first bonding wires for respectively connecting the first electrodes and first lead frames;
   second bonding wires for respectively connecting the second electrodes and second lead frames; and
   a fixing member comprising a loop shaped base placed on the first and the second lead frames and a loop shaped supporting portion connected to the base and placed on the first bonding wires and under the second bonding wires;
   wherein the semiconductor element is supported by the fixing member and the first and the second lead frames.

16. The semiconductor device of claim 15, wherein the fixing member prevents the first bonding wires and the second bonding wires from coming into contact with each other.

17. The semiconductor device of claim 15, wherein the fixing member comprises multiple loops and makes contact with each of the first bonding wires and each of the second bonding wires at two or more points thereon.

18. The semiconductor device of claim 15, wherein the fixing member comprises depressions formed at surfaces thereof, and the first bonding wires and the second bonding wires are respectively placed in the depressions.

19. The semiconductor device of claim 18, wherein the depressions prevent contact between mutually adjacent first bonding wires and between mutually adjacent second bonding wires.

20. The semiconductor device of claim 15, wherein the fixing member extends around an entire periphery of the semiconductor device.

* * * * *